United States Patent [19]

Sahagun

[11] 3,775,197

[45] Nov. 27, 1973

[54] METHOD TO PRODUCE HIGH CONCENTRATIONS OF DOPANT IN SILICON

[76] Inventor: Armen N. Sahagun, 16757 Bolero Ln., Huntington Beach, Calif. 92649

[22] Filed: Jan. 5, 1972

[21] Appl. No.: 215,631

[52] U.S. Cl. .................. 148/188, 148/186, 148/187
[51] Int. Cl. .................................................. H01l 7/36
[58] Field of Search..................... 148/188, 187, 186

[56] References Cited

UNITED STATES PATENTS

| | | | |
|---|---|---|---|
| 3,041,214 | 6/1962 | Goetzberger | 148/188 X |
| 3,541,676 | 11/1970 | Brown | 148/188 UX |
| 3,673,679 | 7/1972 | Carbajal et al. | 148/188 X |

*Primary Examiner*—G. T. Ozaki
*Attorney*—Spensley, Horn and Lubitz

[57] ABSTRACT

A novel method for producing very high concentrations of semiconductor dopants in silicon by a diffusion process. The concentration of dopant achievable by the present invention approaches the solid solubility limit of the dopant material. First an undoped layer of material, typically silicon dioxide, is deposited over one or both of the planar surfaces of a silicon substrate of a particular conductivity type. Next a second layer of doped silicon dioxide is deposited over the first layer, the dopant therein being of a conductivity type opposite of that of the silicon wafer. A third layer of undoped silicon dioxide is then deposited over the second layer. Next, the substrate of silicon, with the three layers deposited thereon, is heated to a temperature which causes the diffusion of some dopant into the upper region of the silicon substrate. The three layers of silicon dioxide are then stripped off, and three fresh layers are deposited. The heating step is repeated, "pumping," by diffusion, more dopant into the silicon substrate from the fresh source. The process can be repeated, thereby enabling the concentration of dopant in the silicon substrate to approach the solid solubility limit. This invention also contemplates growing the layers of silicon dioxide by controlled oxidation of the substrate, instead of by depositing them.

3 Claims, No Drawings

METHOD TO PRODUCE HIGH CONCENTRATIONS OF DOPANT IN SILICON

BACKGROUND OF THE INVENTION

1. Field of the Invention

This invention relates generally to the semiconductor art and, more particularly, to a method for producing very high concentrations of dopants in silicon.

2. Prior Art

It has heretofore been known how to diffuse dopants into silicon by methods of the prior art typically practiced in the production of semiconductor devices. However, the methods of the prior art have fallen far short of achieving the high concentrations of dopants which are theoretically possible. For example, a phosphorous dopant can theoretically replace approximately $10^{22}$ atoms of silicon per cubic centimeter. Such a hypothetically doped silicon wafer would have a V/I, or resistivity, value of approximately 0.0005 ohm-centimeters, its theoretical limit. The methods of the prior art yield doped silicon having a resistivity in the range from 0.2 to 0.9 ohm-centimeters, substantially higher than the theoretical lower limit.

Because of the limited concentrations of dopant in silicon achievable by the methods of the prior art, penetration of the dopant into the silicon has also been limited. Thus, as a direct consequence of limited penetration, it has heretofore been necessary to utilize relatively thin wafers of silicon in the production of semiconductor devices, typically 5 – 6 mils in thickness. The use of relatively thin wafers has a highly detrimental effect upon production yield in that thin wafers are highly susceptible to breakage, bowing and related workage problems. The use of thin wafers also results in lower breakdown voltages in the semiconductor devices produced.

The methods of the prior art for diffusing dopants into silicon typically require relatively high temperatures in order to achieve acceptable concentrations of the dopant therein. The use of relatively high diffusion temperatures, like the use of thin wafers, has a highly detrimental effect upon production yield. At the higher temperatures there is an increase in the percentages of warpage, pitting and alloying of the dopant with the silicon. However, production yields achievable by practicing the present invention may range from 40–50 percent as compared to only 2–3 percent typical in the prior art.

The inability of the methods of the prior art to achieve high concentrations of dopant in silicon also has adverse effects on certain parameters of the semiconductor devices produced. Devices produced by these methods typically exhibit high current gain falloff, snap-back, and high saturation resistance.

The basic limitation of the methods of the prior art lies in the fact that the level of available dopant atoms, capable of diffusing into the silicon, falls off increasingly as the diffusion process takes place.

Consequently, before very high concentrations of the dopant in the silicon can be reached, the dopant source ceases to yield dopant atoms across the surface into the silicon, notwithstanding (i) the high temperatures to which the materials are subjected, and (ii) the fact that a large number of dopant atoms remain in the dopant source. In effect, the dopant source becomes exhausted at a time when the concentration of the dopant remains substantially below its theoretically upper limit, typically after approximately 40 minutes of diffusion. The present invention overcomes this basic limitation of the prior art by teaching the novel process of repeating the diffusion step after the exhaustion of the dopant source causes a substantial reduction in the rate of diffusion. Thus, after the dopant source is effectively exhausted, it is removed, and a fresh layer of the material utilized as the dopant source is deposited over the silicon. The diffusion step is then repeated until the fresh dopant source is also exhausted. The latter, however, is able to provide additional free dopant atoms into the silicon thereby increasing the concentration of dopant therein. The diffusion step may be repeated a number of times. Each subsequent diffusion step, however, increases the level of concentration by a smaller increment as the solid solubility limit of the dopant is approached.

As a consequence of the higher concentration of dopants in silicon, achievable by the present invention, a number of shortcomings and limitations of the prior art are overcome. Firstly, semiconductor devices produced from silicon wafers having a very high concentration of dopant have lower resistivity levels. Resistivity levels near 0.02 ohm-centimeters are achievable by the invented method, whereas the prior art typically yields resistivities in the range from 0.2 to 0.9 ohm-centimeters.

The very high concentration of dopant produced by the present invention results in deeper penetration of the dopant into the silicon than heretofore obtained. Thus, the invented method enables the silicon wafers used in the production of semiconductor devices to be substantially thicker than heretofore possible. More specifically, the present invention permits the use of wafers having an initial thickness of approximately 8–9 mils as compared to the 5 – 6 mils thickness of wafers utilized in the prior art. The use of thicker wafers substantially increases production yields by reducing the losses attributable to breakage, bowing and other workage related damage. An additional advantage of thicker wafers, of course, is the increase in breakdown voltage. The present invention makes possible breakdown voltages in excess of 2,000 volts.

The repetition of the diffusion step, as taught by the present invention, enables high concentrations of dopant in silicon to be achieved at diffusion temperature significantly below those required by the methods of the prior art. For example, by repeating the diffusion step once, the invented method can achieve at approximately 1,000° C. a dopant concentration in the prior art only at a temperature of approximately 1,250° C. Further, a third diffusion step at 1,000° C. yields a concentration of dopant higher than that attainable heretofore, even at temperatures in excess of 1,250° C. Thus, by making possible the attainment of very high concentrations of dopant in silicon at relatively low temperatures, the present invention has the dual advantage of improving the characteristics of the semiconductor devices produced while at the same time increasing production yields by reducing warpage, pitting and alloying, all of which occur with greater frequency at higher temperatures.

Reference was made hereinabove to the improved characteristics of semiconductor devices attributable to the present invention. In addition to substantially lower resistivity and higher breakdown voltages, the invented method also makes possible, by virtue of the very high concentrations of dopant attainable, the following improvements in semiconductor devices:

i. a more constant and steeper dopant gradient, manifesting a more uniform distribution of dopant in the silicon;
ii. minimization of high current gain fall-off, yielding improved efficiency at higher current levels;
iii. less power loss due to the lower saturation resistance;
iv. reduction of the base resistance, $R_b'$, yielding increased power efficiency;
v. in transistors, higher $V_{cex}$, i.e., higher collector-to-emitter leakage voltage, thereby substantially reducing snap-back.

The present invention is of particular advantage in applications requiring very high breakdown voltages or deep diffusion especially, for example, in single diffusion transistors. However, as can readily be seen, the benefits of the present invention are not limited to single diffusion devices.

Another feature of the present invention, related to the method of depositing the dopant source over the silicon, produces additional advantages over the results attainable by the methods of the prior art. The present invention teaches the deposition of a relatively thin layer of undoped glass, or the growth of a thin layer of undoped silicon dioxide, upon the silicon wafer prior to the deposition of a second layer of doped material thereon; i.e., the dopant source. This is followed by a third layer of undoped material. In the prior art, on the other hand, the dopant source is typically deposited directly upon the silicon wafer. By virtue of this new method, a significant reduction of the surface pitting and alloying which typically occur during the diffusion step is achieved. In addition, the improved surface conditions thereby attained enhance the uniformity of the distribution of dopant in the silicon.

BRIEF SUMMARY OF THE INVENTION

The present invention provides a novel method for producing very high concentrations of dopants in silicon. The invented method enables the production of semiconductor devices having superior characteristics relative to those produced by the methods of the prior art. In addition, the present invention substantially increases the production yield because it permits the use of thicker silicon wafers and diffusion at lower temperatures than heretofore possible.

The present invention operates upon a silicon wafer typically doped to be either of P or N conductivity type. The surface conditions of the silicon wafer are not critical; thus, no polishing of the wafer surface is required, ordinary lapping of the surface being adequate. In the next sequence of steps, three layers of material are deposited on the surface of the wafer. A first layer, i.e., one which is in contact with the silicon, is undoped; a second layer is doped with material which, when diffused into silicon, yields a semiconductor of a conductivity type opposite to that of the wafer; and a third and outermost layer is undoped. The three layers may be of a glass, typically silicon dioxide, which is deposited by techniques known in the art such as, for example, sputtering. Alternatively, each of the three layers may be grown silicon dioxide produced by the controlled oxidation of the silicon wafer.

The next step of the present invention is the diffusion of the dopant into the silicon wafer by the application of heat. This step is completed when the diffusion rate decreases to close to zero. Then the silicon wafer is removed from the heat, and the three layers of material previously deposited or grown on it, including an additional layer of silicon dioxide grown during the diffusion step, are removed entirely by conventional etching means. At this point the silicon wafer, containing the dopant which had diffused from the original layer of dopant source, is in a condition for another cycle of deposition and diffusion. The sequence of deposition and diffusion is repeated until the dopant in the silicon increases to the desired concentration.

Thus, it is a principal object of the present invention to provide a method for producing very high concentrations of dopant in silicon.

It is another principal object of this invention to increase the production yield of semiconductor devices.

A further object of this invention is to produce doped silicon wafers having concentrations of dopant approaching the solubility limits of the dopant used.

A still further object of the invented method is to enable the production of semiconductor devices having very high breakdown voltages, lower base resistances, reduced high current gain fall-off and lower saturation resistances.

The novel features which are characteristic of the present invention as well as other objects and advantages thereof will be better understood from the following detailed description.

DETAILED DESCRIPTION OF THE INVENTION

A first step of the invented method is to provide a suitably doped monocyrstalline planar wafer of silicon of either P or N conductivity type, the surfaces of which have been prepared by known techniques for receiving a dopant source by deposition. The surfaces of the wafer need not be highly polished; conventionally lapped surfaces are adequate. The next basic step is the deposition of a dopant source upon the surfaces of the wafer. The dopant is typically one which, when diffused into silicon, yields a semiconductor of a conductivity type opposite that of the wafer. Thus, if the silicon wafer used is originally doped so as to be of P conductivity type, the dopant source deposited thereon is one which, in the region where diffused, will cause the silicon wafer to be of N conductivity type.

Although conventional means for depositing the dopant source on the surfaces of the wafer may be used, the present invention teaches a preferred method for doing so. Instead of merely depositing a layer of material containing the dopant directly upon the surfaces of the wafer, the following steps are disclosed: A first layer of undoped material, typically silicon dioxide, is deposited onto one or both of the planar surfaces of the wafer by conventional means such as, for example, sputtering. The thickness of the first layer is typically within the range of 100 – 1,000 Angstroms. Next, a second layer of silicon dioxide, containing the dopant material, is deposited over each of the first undoped layers. Dopant materials typically used to yield N conductivity type silicon are phosphorous trichloride, $PCl_3$, and phosphorous oxychloride, $POCl_3$. When the silicon wafer is originally of N conductivity type, a dopant suitable for yielding P conductivity type silicon in the diffused region is boron oxide, $B_2O_3$. The thickness of the second doped layer is typically in the range of 500 – 2,000 Angstroms. Finally, a third layer of undoped silicon dioxide is deposited over each of the second layers, having a thickness in the range from 100 – 1,000 Angstroms. At this point the semiconductor structure, comprising the silicon wafer and three layers of deposited glass or silicon dioxide on one of both of its planar surfaces, is ready for the basic diffusion step. The semiconductor structure described hereinabove is less susceptible to surface pitting and alloying when subjected to the temperatures required for diffusion than structures wherein a single layer of dopant source is deposited directly upon the surface of the wafer.

The next step of the invented method is the diffusion of the dopant into the silicon wafer by the application of heat. Thus, the semiconductor structure is placed in an oven at a temperature in the range of from 1,000° to 1,250° C. The atmosphere is typically a mixture of nitrogen and oxygen. The duration of the diffusion step is approximately 40 minutes; i.e., after this period of time, the diffusion rate is typically too low to justify continued heating. During the diffusion step, a new layer of silicon dioxide is grown to an extent determined by the amount of oxygen in the oven's atmosphere. This layer of new oxide is desirable in that it tends to mitigate damage to the original first layer of oxide. However, its thickness must be controlled; if it becomes too thick, it tends to peel off the body of the wafer.

In a next step of the present invention, the semiconductor structure is removed from the oven, and the layers of silicon dioxide previously deposited, including the doped layer, are removed entirely by conventional techniques such as, for example, etching with hydrofluoric acid, HF. In addition, the layer of silicon dioxide grown during the diffusion step is also removed. This leaves the silicon wafer in a condition for another cycle of deposition of dopant source and diffusion of dopant. The sequence of deposition and diffusion is repeated at least one time. However, the present invention contemplates the repetition of the steps of deposition and diffusion whatever number of times is required to achieve the desired concentration of dopant in the silicon wafer.

The present invention contemplates a suitable alternative to the deposition of the aforesaid three layers of silicon dioxide onto the silicon wafer. This is to grow the layers of silicon dioxide by the controlled oxidation of the wafer at an elevated temperature within the aforesaid diffusion temperature range. After a first undoped layer of silicon dioxide is grown, the selected dopant material is introduced into the oxidizing atmosphere, thereby forming a second doped layer of silicon dioxide. The dopant material is then removed from the atmosphere, while oxidation and diffusion continue, and a relatively undoped third layer of silicon dioxide is grown. During the growth of the second and third layers, some of the dopant diffuses into the upper region of the silicon wafer. Therefore, a separate diffusion step is not required as is the case when the three layers of silicon dioxide are deposited onto the surface of the silicon wafer. The layers are then stripped off in the manner described above and the sequence repeated to increase the concentration of dopant diffused into the silicon wafer. The rate of growth of the layers of silicon dioxide is known to be a function of certain parameters such as the temperature, the percentage of oxygen by volume in the atmosphere, the rate of flow of oxygen and the relative dryness of the wafer. At a given temperature within the diffusion temperature range, the parameters can be readily determined by those skilled in the art to grow the silicon dioxide at a suitable rate so as to achieve the preferred thickness of the layers within acceptable durations.

Although this invention has been disclosed and described with reference to a particular method, the principles involved are susceptible of other applications which will be apparent to persons skilled in the art. This invention, therefore, is not intended to be limited to the particular method herein disclosed.

I claims:

1. A method of producing high concentrations of dopant in silicon comprising the steps of:
   a. providing a wafer of silicon of a first conductivity type, said wafer having lapped planar surfaces;
   b. depositing a first layer of undoped glass upon each of said planar surfaces, said first layer having a thickness in the range from 100 – 1,000 Angstroms;
   c. depositing a second layer of doped glass over each of said first layers, said second layer containing a dopant which, when diffused into said wafer, causes a region thereof to be of a second conductivity type, opposite that of said first conductivity type, said second layer having a thickness in the range from 500 – 2,000 Angstroms;
   d. depositing a third layer of undoped glass over each of said second layers, said third layer having a thickness in the range from 100 – 1,000 Angstroms;
   e. heating said wafer at a temperature in the range from 1,000° to 1,250° C for approximately 40 minutes, thereby causing the diffusion of said dopant into said wafer and the growth of a fourth layer of silicon dioxide.
   f. removing substantially all of said first, second, third, and fourth layers of glass by etching with hydrofluoric acid;
   g. repeating said steps (b), (c), (d), (e), and (f) at least once in said order until said dopant in said region of said wafer reaches a desired concentration.

2. The method of claim 1 wherein said wafer is of P conductivity type, said glass is silicon dioxide and said dopant is a material which, when diffused into said wafer, cause said region thereof to be of N conductivity type.

3. A method of producing high concentrations of dopant in silicon comprising the steps of:
   a. providing a wafer of silicon of a first conductivity type, said wafer having planar surfaces;
   b. heating said wafer in an oxidizing atmosphere at a temperature in the range from 1,000° to 1,250° C until a first layer of silicon dioxide is grown on each of said planar surfaces, said first layer having a thickness in the range from 100 – 1,000 Angstroms;
   c. introducing a dopant into said oxidizing atmosphere while heating said wafer at said temperature until a second layer of doped silicon dioxide is formed over each of said first layers, some of said dopant diffusing through said first layers into said wafer and causing a region thereof to be of a second conductivity type opposite that of said first conductivity type, said second layer having a thickness in the range from 500 – 2,000 Angstroms;

d. removing said dopant from said atmosphere and continuing said heating at said temperature until an undoped third layer of silicon dioxide is grown over each of said second layers while said dopant therein continues to diffuse into said region of said wafer, said third layer having a thickness in the range from 100 – 1,000 Angstroms;

e. removing substantially all of said first, second and third layers of silicon dioxide by etching said wafer with hydrofluoric acid;

f. repeating said steps (b), (c), (d) and (e) at least once in said order until said dopant in said region of said wafer reaches a desired concentration.

* * * * *